United States Patent

Magoshi

[11] Patent Number: 5,886,901
[45] Date of Patent: Mar. 23, 1999

[54] FLIP-FLOP FOR SCAN TEST CHAIN

[75] Inventor: Hidetaka Magoshi, Palo Alto, Calif.

[73] Assignee: LSI Logic Corporation, Milpitas, Calif.

[21] Appl. No.: 779,628

[22] Filed: Jan. 7, 1997

[51] Int. Cl.⁶ .................................................. G01R 31/28
[52] U.S. Cl. ...................... 364/490; 364/489; 364/488; 371/22.31; 371/22.5
[58] Field of Search .................... 364/490, 489, 364/488; 371/22.1, 22.31, 22.5, 25.1

[56] References Cited

U.S. PATENT DOCUMENTS

| | | | |
|---|---|---|---|
| 4,879,718 | 11/1989 | Sanner | 371/22.36 |
| 4,931,722 | 6/1990 | Stocia | 371/22.5 |
| 5,056,094 | 10/1991 | Whetsel | 371/25.1 |
| 5,329,167 | 7/1994 | Farwell | 371/22.31 |
| 5,534,789 | 7/1996 | Phillips et al. | 326/108 |
| 5,592,493 | 1/1997 | Crouch et al. | 371/22.34 |
| 5,671,234 | 9/1997 | Phillips et al. | 371/22.31 |
| 5,717,700 | 2/1998 | Crouch et al. | 371/22.31 |

*Primary Examiner*—Vincent N. Trans

[57] ABSTRACT

An method for designing integrated circuits for a serial scan test using an improved, modular flip-flop cell is presented. The modular flip-flop cell has a delay element strategically placed in the serial scan chain to reduce the occurrence of hold time violations. The delay element is located in a test path along the serial scan chain. The delay element causes the hold time of the test input terminal to be non-positive, ensuring that there are no hold time violations, while not affecting the time delay on the normal data path.

5 Claims, 8 Drawing Sheets

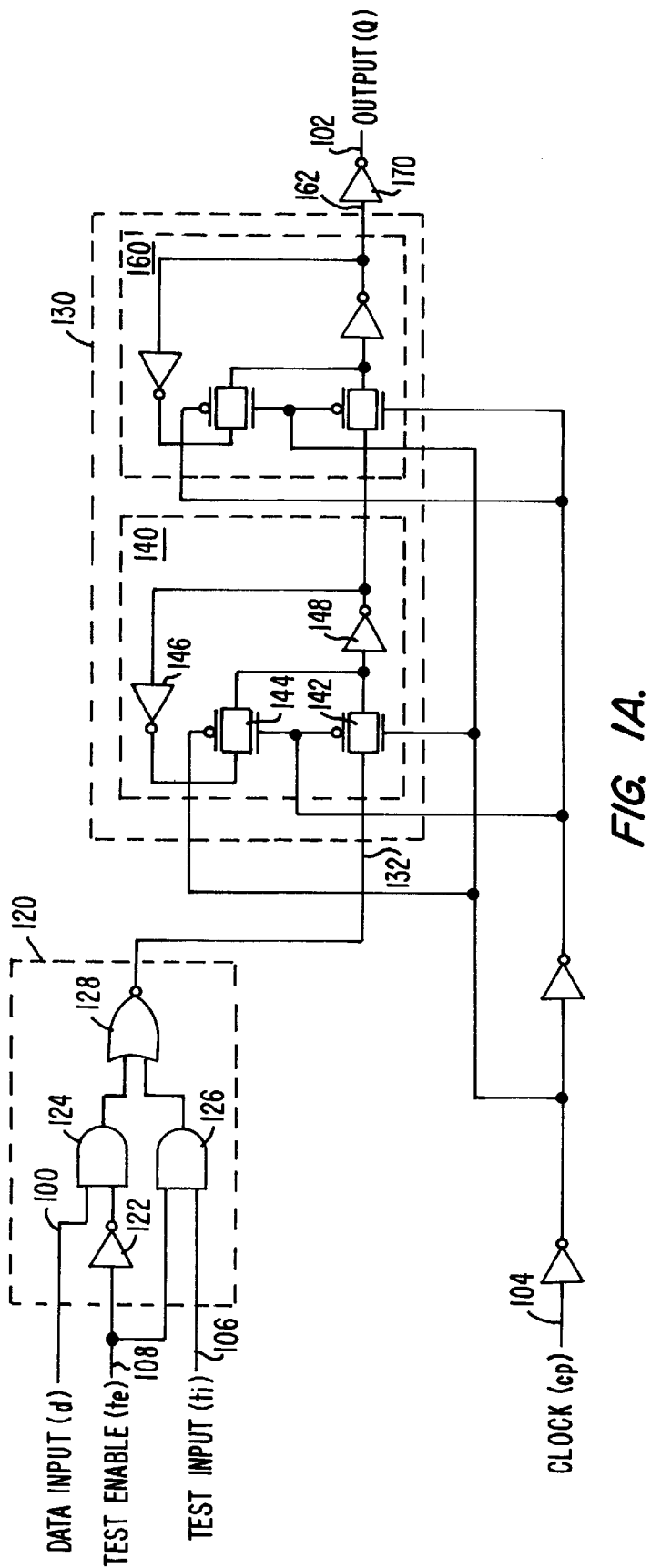
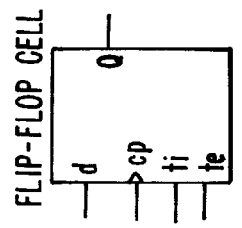
FIG. 1A.
FIG. 1B.
FIG. 1C.

FLIP-FLOP FOR SCAN TEST CHAIN

BACKGROUND OF THE INVENTION

The present invention relates generally to flip-flop cells, and more particularly to flip-flop cells which have been designed to be modularly placed in the serial scan chain of an integrated circuit device. A serial scan chain is used as part of a serial scan test to verify the integrity of the integrated circuit after it has been fabricated. Due to the complexity of modern integrated circuitry, it is not feasible to adequately test newly fabricated devices by simply operating each device in its intended environment. It is therefore necessary to provide an efficient method of more exhaustively testing the devices after manufacture.

A serial scan test is accomplished by "daisy-chaining" all of the flip-flop cells together by connecting the output of one flip-flop cell to the input of the next flip-flop cell to form a serial scan chain. This serial scan chain operates functionally as a serial shift register. Known data is shifted serially into the flip-flop cells through this serial scan chain. Once the data is in place, the output pins of the integrated circuit are sampled and the results are compared with the expected output. If the results are not as expected, the device is known to be defective.

Typically, a flip-flop cell that is used for a serial scan chain has a test input, a data input, a test enable, and a data output line. During normal operation, the flip-flop cell receives input data from the data input line. When the integrated circuit is placed in test mode by asserting the test enable line, the flip-flop cell accepts data from the test input line.

A problem is associated with a serial scan chain built with this typical type of flip-flop cell. This problem relates to the timing specifications of the flip-flop cell. In particular, chaining successive flip-flop cells directly together often causes violations to the hold time specification of the flip-flop cell.

A flip-flop cell typically operates by transferring data on its input line to its output line whenever it senses the appropriate edge of the clock signal. Thereafter, the output line remains the same until the following clock edge. The data on the input line must be held for a period of time after the edge of the clock to ensure that the correct data is transferred to the output. This period of time is the hold time.

In the normal data path, a circuit contains combinational logic between successive flip-flops cells. This combinational logic serves to delay the time before the data on the input lines of subsequent flip-flop cells actually changes after the output of a flip-flop cell is changed. However, in the serial scan chain, the output of one flip-flop cell is connected directly to the input of the next flip-flop cell. With no additional logic between flip-flops cells to cause a delay, the input lines change almost immediately upon the arrival of the clock signal to the preceding flip-flop cell. Frequently, this causes the hold time specifications to be violated.

To remedy this problem, an additional delay element must be manually inserted after the design is completed between flip-flop cells in the serial scan chain to remove the timing violations. For large designs, the task is time-consuming and an inefficient use of resources. As the size of integrated circuitry becomes larger, it is increasingly important to have modular parts that can be inserted into a design without requiring custom fixes to clear up timing violations. Ideally, this should be done without affecting the timing of the normal data path.

Consequently, it is desirable to find an improved method of designing integrated circuits with serial scan chains by the modular placement of improved flip-flop cells which do not have hold time violations in the serial scan chain.

SUMMARY OF THE INVENTION

In view of the above, the present invention provides a method for designing integrated circuits with a serial scan chain using an improved, modular flip-flop cell.

In accordance with the present invention is a method for designing an integrated circuit having a serial scan chain of modular flip-flop cells. The modular flip-flop cell is designed by defining a clock terminal having a clocking event when a clock signal applied to the clock terminal changes from a first clock logic state to a second clock logic state. A data storage element is created having a data storage input and a data storage output. The data storage element transfers data from the data storage input to the data storage output at the clocking event.

A test enable terminal is defined for the modular flip-flop cell, along with a data input terminal that is selectively coupled to the data storage input when the test enable terminal is at a first logic state. A test input terminal is also defined that is selectively coupled to the data storage input when the test enable terminal is at a second logic state.

A test input hold time is determined. The test input hold time is the minimum time that data must be stable on the test input terminal after the clocking event to ensure that the data is accurately transferred from the data storage input to the data storage output. A test path is defined between the test input terminal and the data storage element. A delay element is added in said test path such that the test input hold time is non-positive.

A plurality of the modular flip-flop cells are placed in an integrated circuit. They are "daisy-chained" together with the test input terminal of one modular flip-flop cell being coupled with the data output terminal of a preceding modular flip-flop cell.

In one embodiment of the present invention, the delay element is placed between the test input terminal and a multiplexer circuit used to select between the test path and a data path from the data input terminal to the data storage input. In a second embodiment the delay element is placed within the multiplexer circuit, between a first stage and a second stage.

Another embodiment further defines a data output terminal and a test output terminal, each of which are coupled with the data storage output. In this embodiment, a delay element is placed between the data storage output and the test output terminal. The delay element is designed such that the time delay for a signal travelling from the data storage element to the test output terminal is greater than the hold time for the test input terminal.

This method of the present invention will be better understood by referencing the drawings and the following description of the preferred embodiment.

BRIEF DESCRIPTION OF THE DRAWINGS

FIG. 1A shows a known flip-flop cell.

FIG. 1B depicts a truth table for the flip-flop cell of FIG. 1A.

FIG. 1C depicts a logic symbol for the flip-flop cell of FIG. 1A.

DESCRIPTION OF THE PREFERRED EMBODIMENT

Figure 2:
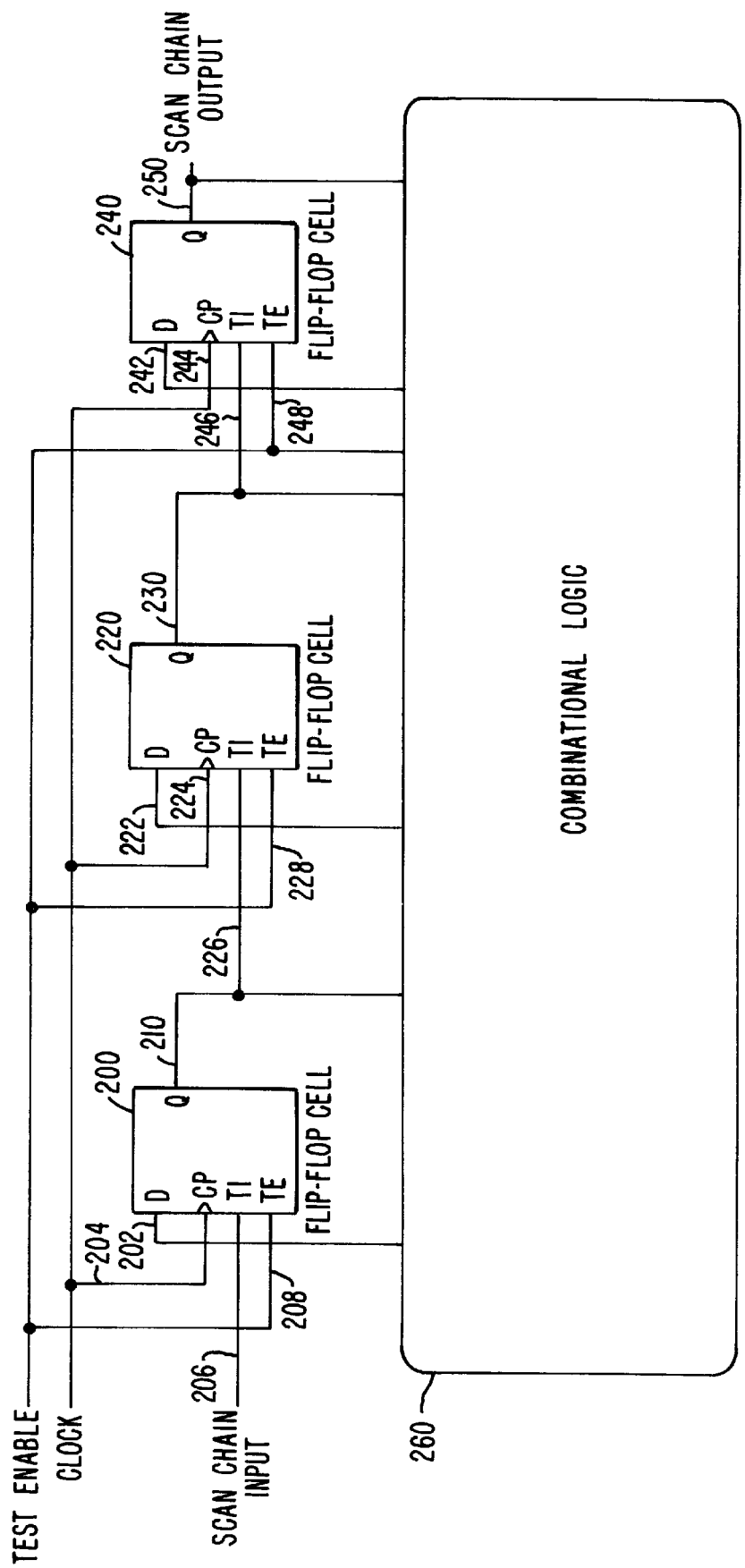
FIG. 2 shows the use of a flip-flop cell in a serial scan chain in an integrated circuit.

A method for designing integrated circuits that use a serial scan test with an improved, modular flip-flop cell is presented. While the following specification describes specific implementations of the invention, it is intended that such descriptions are examples to aid the understanding of the specification. It will be readily apparent to one skilled in integrated circuit design that various elements or structures of the examples can be altered to produce similar results, without changing the nature and scope of the invention. No limitation on the claims is intended or implied by the cited examples.

FIG. 1A depicts a known flip-flop cell that is commonly used in integrated circuit design. A flip-flop cell serves as a data storage device. That is, data on the output of the flip-flop cell is held constant despite changes to the input until the occurrence of clocking event. Referring to FIG. 1A, data is stored on the device by introducing it at the data input terminal 100. At the rising edge of a clock signal on the clock terminal 104, the data is transferred to the data output terminal 102. As described above, the data on the data output terminal 102 remains constant until the next rising edge of a clock pulse on the clock input terminal 104.

While this example shows the clocking event to be the rising edge of the clock, it is apparent to one skilled in the art that the circuit could be designed such that the data is stored on the falling edge of the clock signal without changing the functionality of the design.

The flip-flop cell of FIG. 1A also provides a test input terminal 106 and a test enable terminal 108. When the test enable terminal 108 is not asserted, the data on the data input terminal 100 is selected, and the circuit operates as described in the above paragraph. However, when the test enable terminal 108 is asserted, the data is taken from the test input terminal 106 upon the assertion of the clock pulse on the clock input terminal 104. This operation is described pictorially in the truth table of FIG. 1B. The logical symbol of the flip-flop cell symbol is shown in FIG. 1C.

Again referring to FIG. 1A, a multiplexer circuit 120 is depicted. The multiplexer circuit 120 selects whether the data on the data input terminal 100 is stored or the data on the test input terminal 106 is stored. The multiplexer circuit 120 consists of two stages. In the first stage, the multiplexer circuit 120 passes on the signal of only one of the input lines, depending upon the logic state of the test enable terminal. In the second stage, the results are summed together to provide a single output.

In the first stage, the test enable terminal 108 is tied to an input of a first AND-gate 124 through an inverter 122. The data input terminal 100 is connected directly to another input of the first AND-gate 124. The test enable terminal is connected directly to an input of a second AND-gate 126 and the test input terminal 106 is connected to another input of the second AND-gate 126.

In the second stage, the outputs of each of the first AND-gate 124 and the second AND-gate 126 are connected to inputs of the NOR-gate 128. By this arrangement, when the test enable terminal 108 is not asserted, the output of the NOR-gate 128 reflects the inverse of the data input terminal 100. Contrarily, if the test enable terminal 108 is asserted, the output of the NOR-gate 128 reflects the inverse of the test input terminal.

Various other implementations of a multiplexer circuit to select an incoming data source can be readily envisioned by one skilled in the art. Such implementations are not precluded from the scope of this invention.

The data storage element 130 is the portion of the flip-flop cell that actually stores the data. It is comprised of two stages. During the first half of the clock cycle, the data is transferred from a data storage input 132 to a first stage 140. During the second half of the clock cycle, the data is transferred from the first stage 140 to the second stage 160.

The first stage 140 consists of an input pass transistor 142 and a holding pass transistor 144 that are arranged such that their outputs are connected together. The common output is coupled back to the input of the holding pass transistor 144 through a series of inverters 146, 148. The input of the input pass transistor 142 is the data storage input 132 which is coupled to the output of the multiplexer circuit 120.

By this arrangement, the output of the first stage 140 depends upon which of the pass transistors 142, 144 is activated. If the input pass transistor is activated, the output reflects the data on the data storage input 132. If the holding pass transistor 144 is activated, the data is held constant.

The input pass transistor 142 and the holding pass transistor 144 are activated on opposite phases of the clock. During the first phase of the clock cycle, the input pass transistor 142 is activated. During the second phase of the clock cycle, the holding pass transistor 144 is activated. Therefore, data is held constant during the second phase of the clock cycle, and changes during the first phase of the clock cycle to whatever data is on the data storage input 132.

The second stage 160 is identical to the first stage 140 except that the clock signals are reversed. Therefore, data is allowed to enter the second stage 160 during the second phase of the clock cycle, and it is held constant during the first stage of the clock cycle. By this method, the data in the first stage 140 is unchanging during the second phase of the clock when the second stage 160 is active. Therefore, any change to the data output of the second stage 160 will occur only on the rising edge of the clock. The output of this second stage 160 is the data storage output 162.

The data storage output 162 is coupled to the data output terminal 102 of the flip-flop cell through an inverter 170. The inverter 170 serves to return the data output to the original value that the data had when it was input to the flip-flop cell.

The operation of the flip-flop cell of FIG. 1A in an integrated circuit serial scan chain is illustrated in FIG. 2. A first flip-flop cell 200 has a data input terminal 202, a clock input 204, a test input terminal 206 and a test enable terminal 208. A data output terminal 210 of the first flip-flop cell 200 is connected to a second flip-flop cell 220 at its test input terminal 226. The data output terminal 230 of the second flip-flop cell is connected, in turn, to the test input terminal of a third flip-flop cell 240. This chain can be expanded to include as many flip-flop cells as desired. While only three are depicted in FIG. 2, typically a serial scan chain will contain many flip-flop cells.

Each of the test enable terminals 208, 228, 248 are coupled together and connected to a test enable signal. This allows each of the flip-flop cells to be simultaneously placed in test mode to set up the serial scan chain. Similarly, the input clock terminals 204, 224, 244 are connected to a global clock signal. The data input terminals 202, 222, 242 connect to combinational logic 260. The data output lines 210, 230, 250 are also connected into the combinational logic 260. This provides the functionality of the integrated circuit.

As can be seen in FIG. 2, the output of the data output terminals 210, 230 of each of the flip-flop cells 200, 220 are connected directly to the test input terminals 226, 246 of successive flip-flop cells 220, 240. This differs from the connection of the data output terminals 210, 230 to the data input terminals 222, 242. The data output terminals 210, 230 are connected to the data input terminals 222, 242 through the combinational logic 260. It is the absence of any combinational logic in the test path that creates the hold time violations that are solved by the present invention.

Figure 3A:
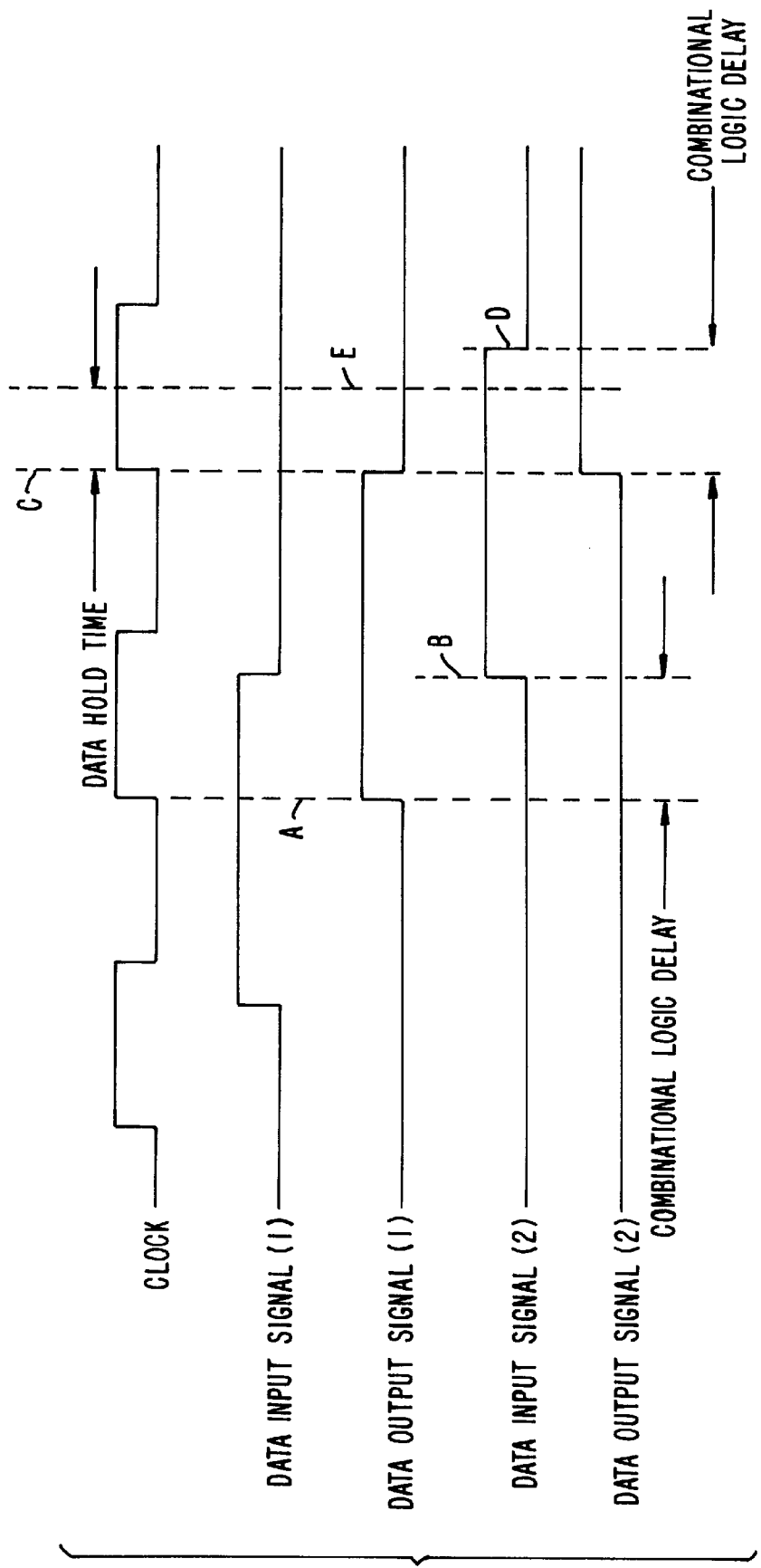
FIG. 3A shows a timing diagram for the operation of a known flip-flop cell along the data path.

The existence of the combinational logic 260 in between successive flip-flop cells adds timing delay to the signals on the lines. In the serial scan chain, since there is no logic to cause a timing delay, timing violations often arise. This problem is shown graphically in FIGS. 3A and 3B. In FIG. 3A, the timing diagram of the data path between two successive flip-flop cells 200, 220 of FIG. 2 is depicted. The event depicted is the latching of a logical "1" into the flip-flop cells 200, 220 in succession, both of which were previously held at a logical "0".

Referring to FIG. 3A, at some time after the rising edge of a previous clock cycle, data input signal(1) is asserted on the data input terminal 202 of the first flip-flop cell 200. Upon the subsequent rising edge of the clock signal, (time "A" in FIG. 3A) the data is stored in the flip-flop cell and is asserted at the data output terminal 210 as data output signal(1). At that point, the signal passes through the combinational logic 260. The data takes a finite amount of time to pass through the logic and at time "B" the signal appears as data input signal(2) on the data input terminal 222 of the second flip-flop cell 220.

Upon the next rising edge of the clock signal, time "C", the second flip-flop cell 220 latches data input signal(2) to its data output terminal 230 as data output signal(2). At the same time, the first flip-flop cell 200 latches a new value for data output signal(1) onto its data output terminal 210. Because of the delay associated with the combinational logic 260 as discussed previously, the data input terminal 222 of the second flip-flop cell 220 does not see a change to the data input signal until time "D". Assuming the device has a data hold time as shown in FIG. 3A as the difference between time "C" and time "E", the specification is met with no timing violations.

Figure 3B:
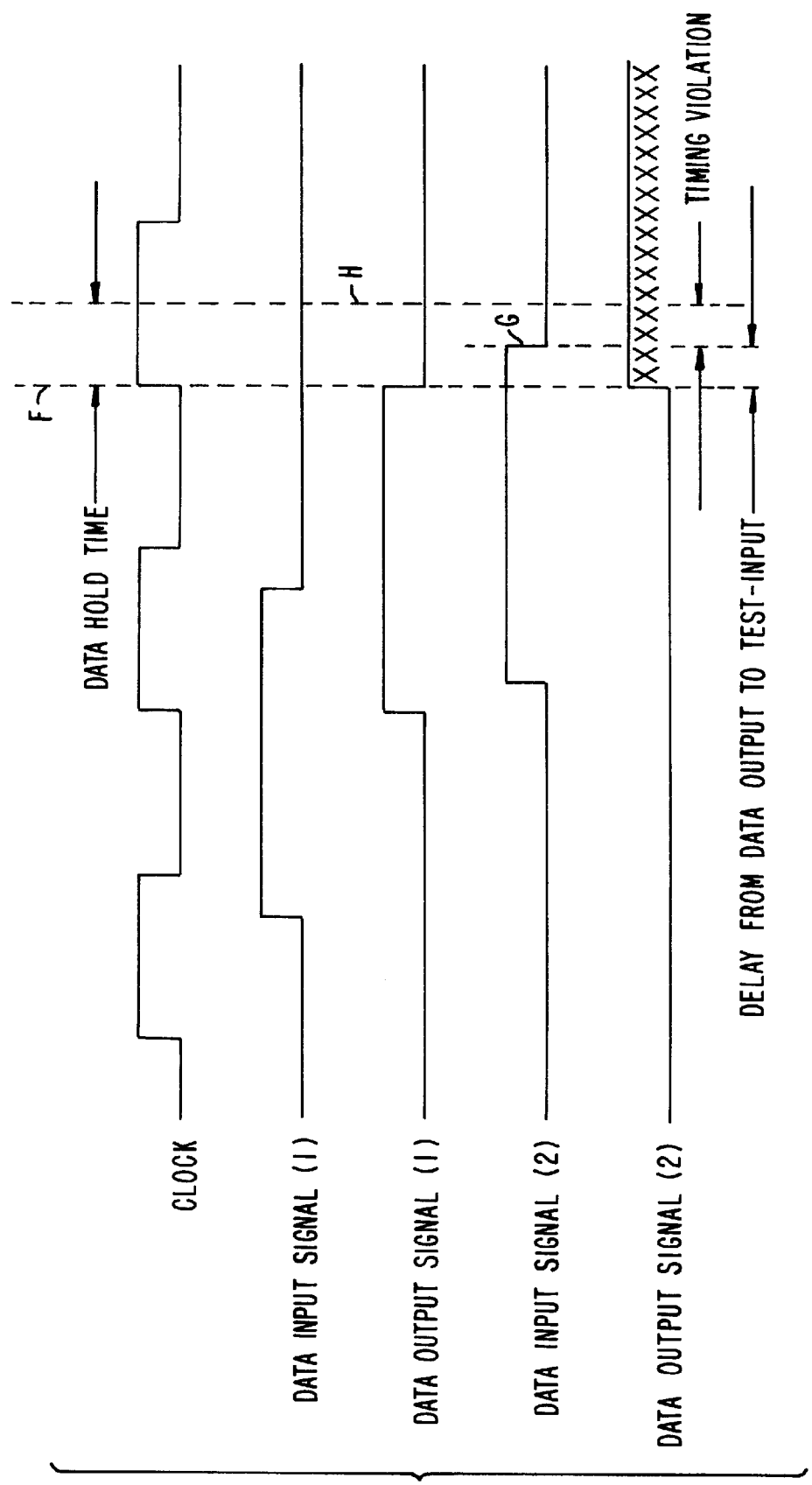
FIG. 3B shows a timing diagram for the operation of a known flip-flop cell along the test path in a serial scan chain.

Now referring to FIG. 3B, the timing problem of the serial scan chain previously referred to is manifest. FIG. 3B depicts the timing diagram of the integrated circuit's test path. In the test path, the combinational logic 260 does not exist between subsequent flip-flop cells 200, 220. Consequently, the timing delay between flip-flop cells 200, 220 is very short. The timing delay is shown in FIG. 3B as the difference between time "F" and time "G". Since the hold time does not change, it can be readily seen by one skilled in the art that timing violations can appear in this configuration. If time "G" arrives before the end of the data hold time at time "H" as shown here, the timing specification is violated and the integrity of the data output signal(2) cannot be assured.

Figure 4:
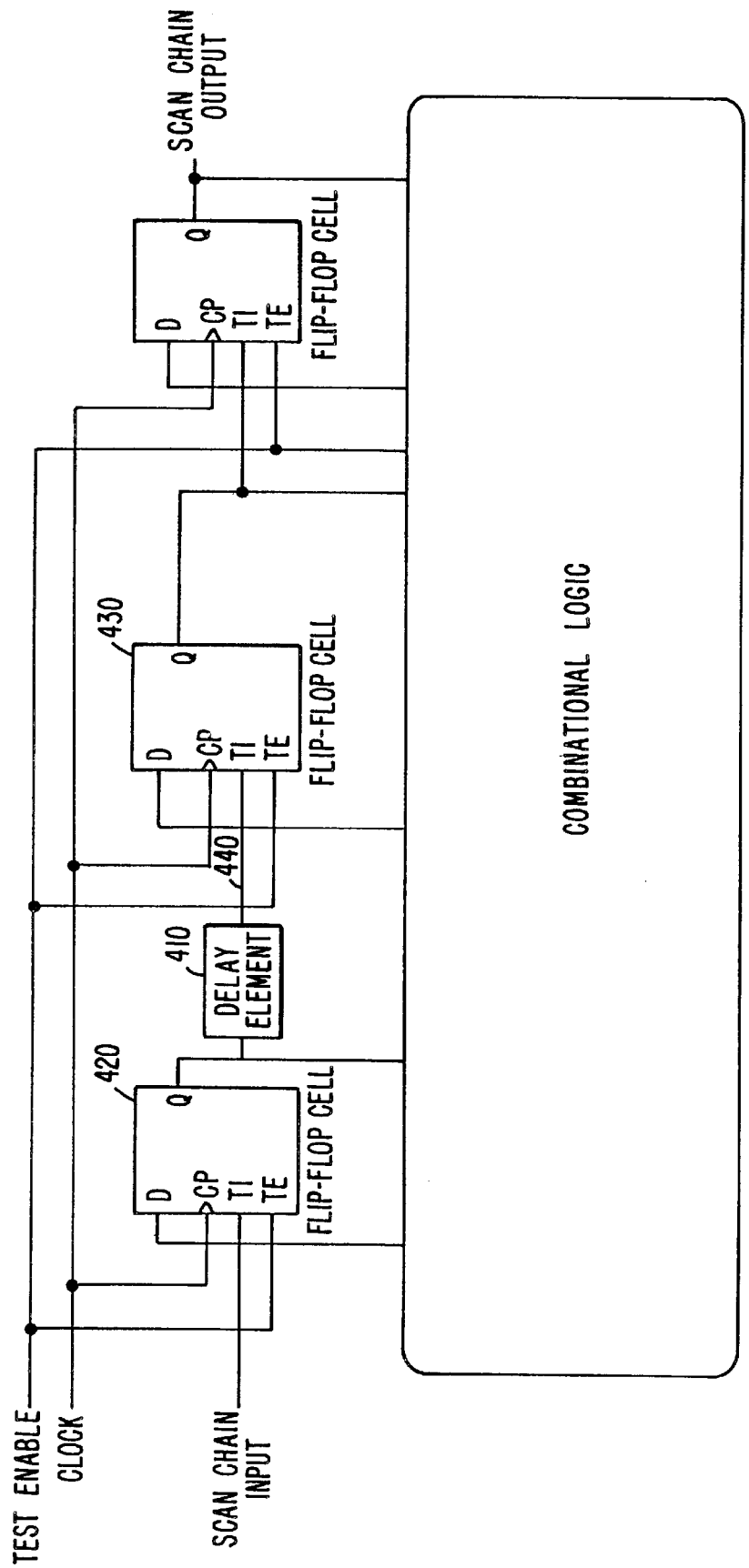
FIG. 4 depicts a method of solving timing violations caused by using a known flip-flop cell in a serial scan chain.

FIG. 4 shows a known solution to this problem. An additional delay element 410 is placed between subsequent flip-flop cells 420, 430 in line with the test input terminal 440. This delay is long enough to ensure that the timing specification is met. Typically, this delay element 410 must be added after the design is completed and custom fit to meet the timing specifications of the device. For large designs, this solution is cumbersome and inefficient. It is desirable to have a modular flip-flop cell that can be "daisy-chained" together in a serial scan chain without additional delay being added and without impacting the timing of the data path.

Figure 5:
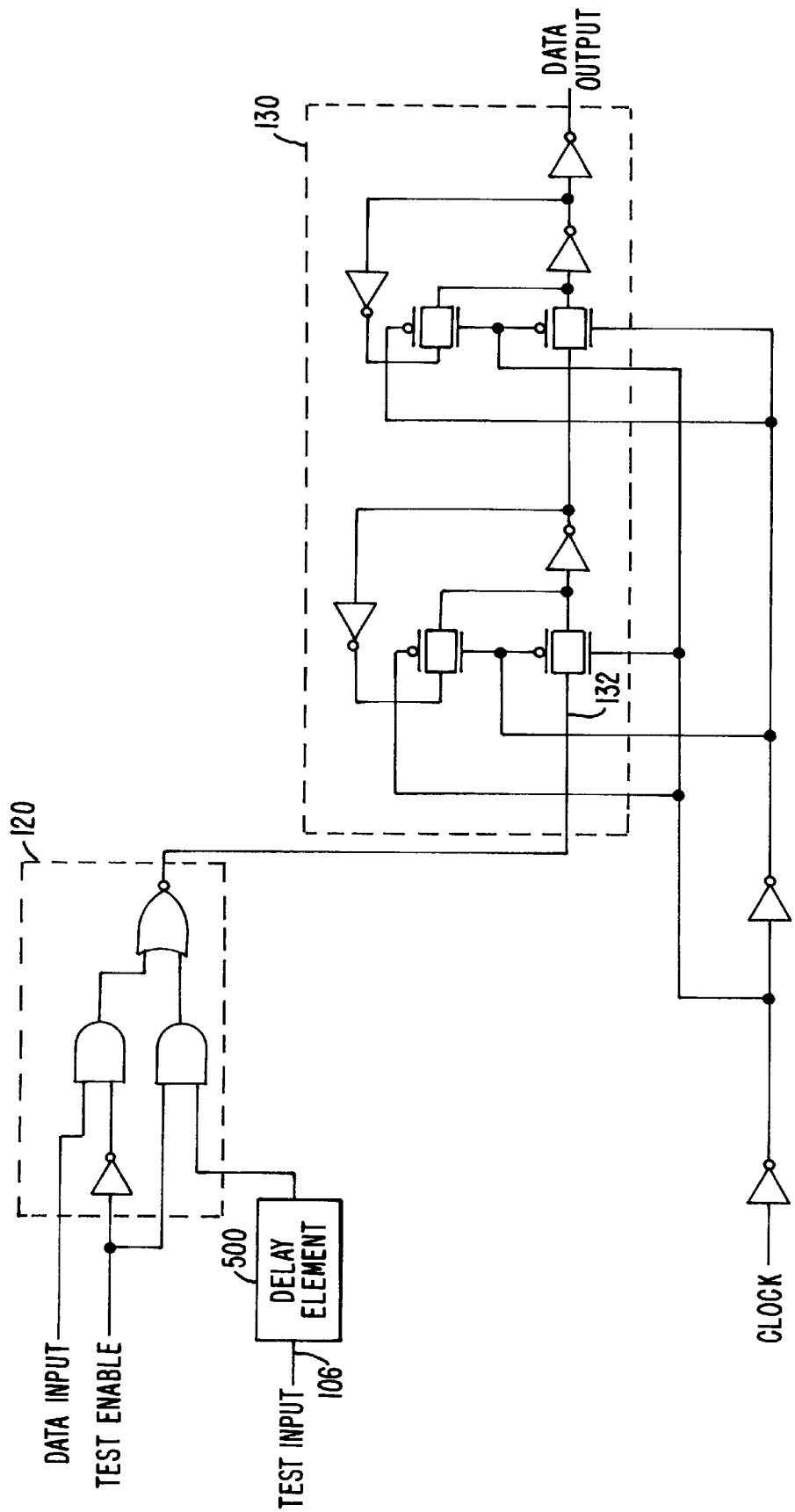
FIG. 5 shows a diagram of a embodiment of the inventive flip-flop cell with a delay element at the input to the multiplexer circuit.

Referring to FIG. 5, a preferred embodiment of an enhanced flip-flop cell of the present invention is shown. A flip-flop cell of FIG. 1A similar to that of FIG. 1A, further has a delay element 500 in its test path. The test path is a path from the test input terminal 106 to the data storage element 130. In this embodiment, the delay element 500 is located between the test input terminal 106 and the multiplexer circuit 120. This delay element 500 can be any structure or element which causes the hold time of the test input terminal 106 to be less than or equal to zero.

The hold time of the test input terminal 106 is the time that the data must remain constant on the test input terminal 106 after the clocking event in which that data is stored. If the hold time is violated, the integrity of the stored data cannot be ensured. The hold time is shown graphically in FIG. 3A as the difference between time "C" and time "E". The hold time is determined by the physical limitations of flip-flop cell. A hold time of zero refers to the situation in which a signal need not be held constant after the clocking event. A less than zero hold time occurs when the signal can actually be changed before the clocking event without affecting the data storage. The delay elements in the test path tend to cause the hold time (time "E") to be shifted toward the left in FIG. 3A.

In one embodiment, this delay element is made, for example, by increasing the timing characteristics of the second AND-gate 126. Another embodiment uses a length of wire as the delay element. However, a number of other methods can be readily determined by one skilled in the art and are covered by this invention. For example, a series of inverters could be strung together to cause a delay.

Figure 6:
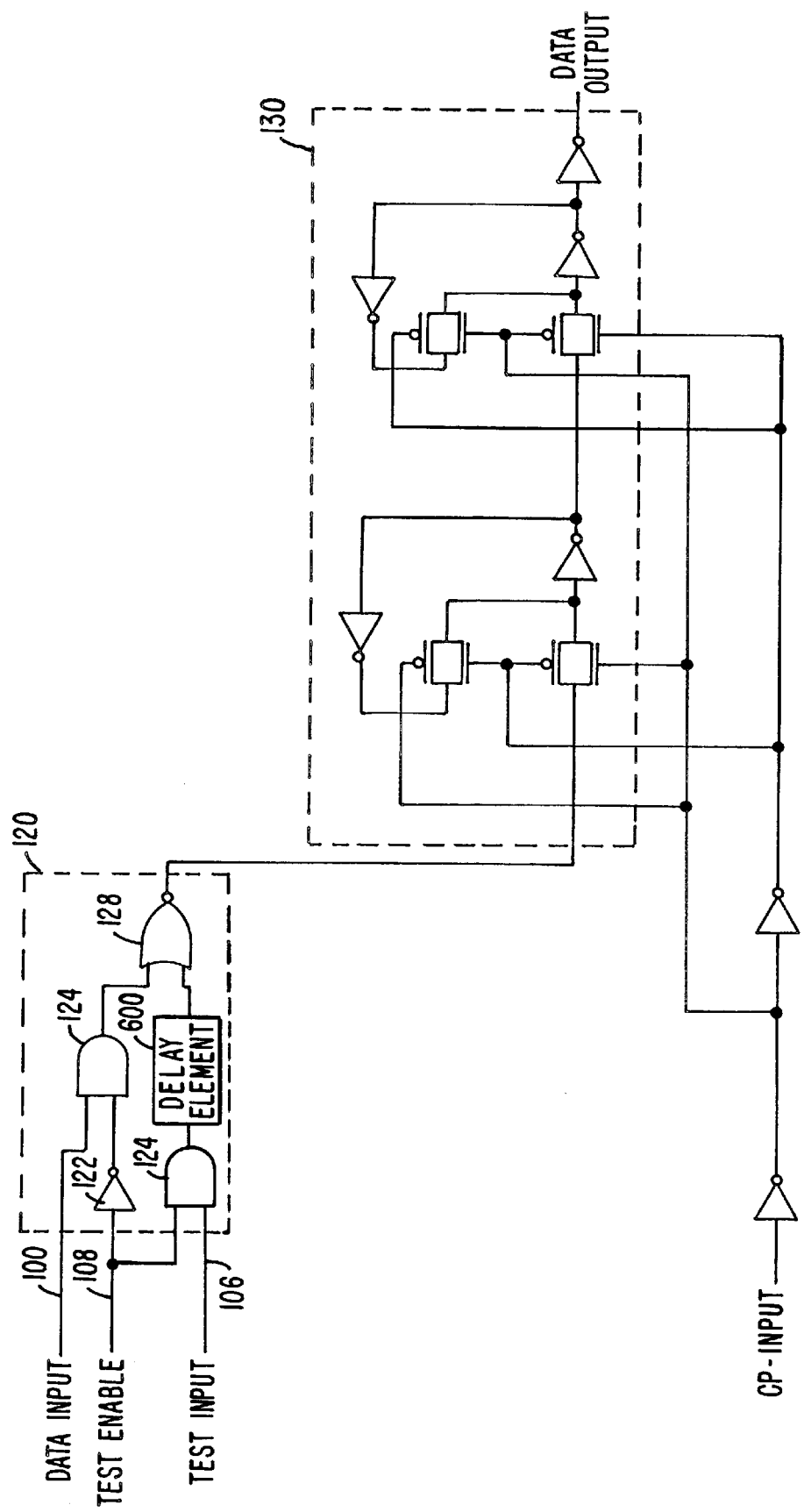
FIG. 6 shows an embodiment of the inventive flip-flop cell with a delay element within the multiplexer circuit.

Referring now to FIG. 6, another embodiment of the present invention is shown. A delay element 600 is situated inside the multiplexer circuit 120 such that the delay affects only the test path. For example, with reference to the multiplexer circuit 120, the delay element 600 is placed between the output of the second AND-gate 124 in the first stage and the input to the NOR-gate 128 in the second stage. This delay element can be any structure or element that causes the hold time of the test input terminal 106 to be less than or equal to zero.

Figure 7:
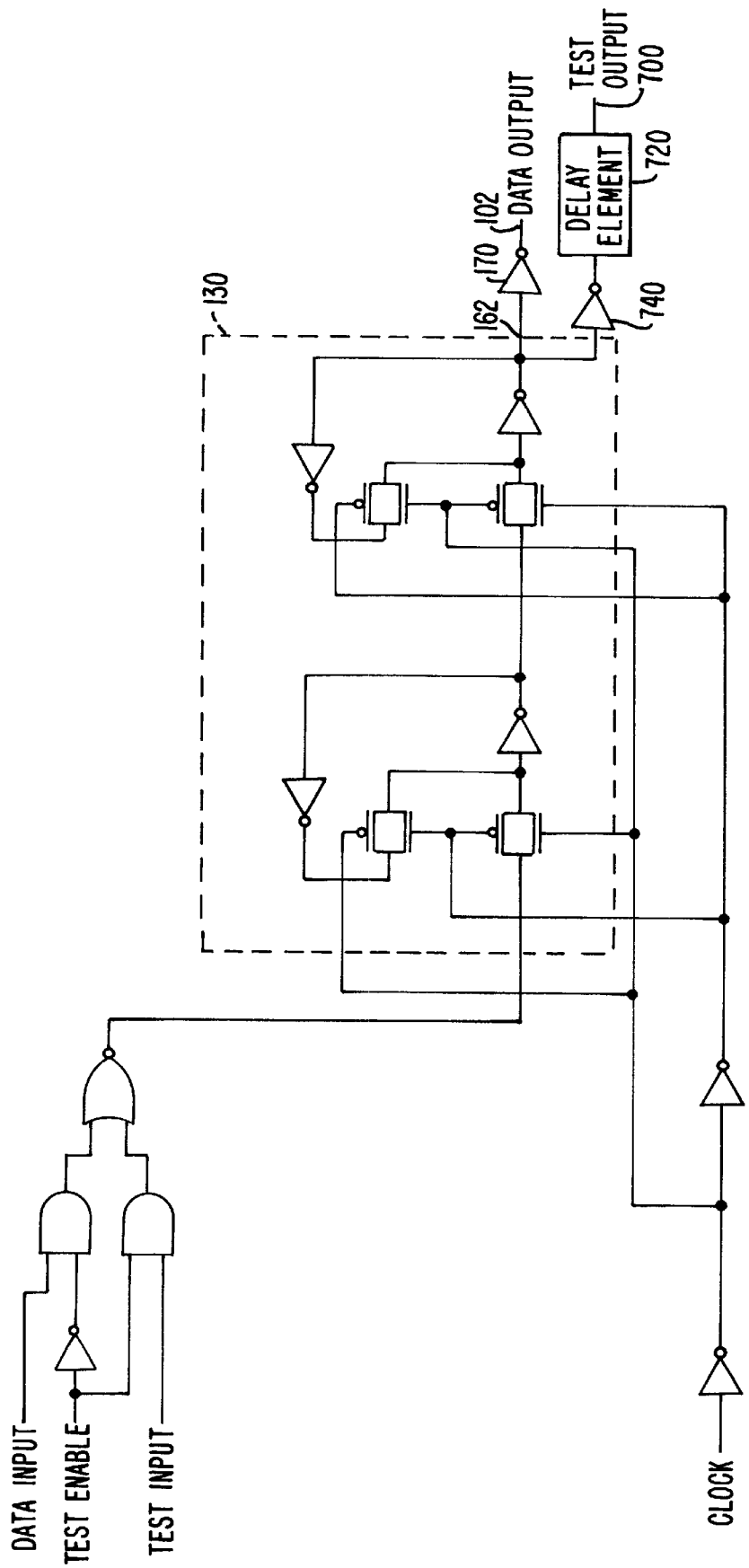
FIG. 7 shows an embodiment of the inventive circuit with a delay element placed in line with a separate test output.

Another embodiment of the present invention is shown in FIG. 7. In this embodiment, a flip-flop cell has a test output terminal 700, along with a data output terminal 102. A delay element 720 is located in between the data storage element 130 and the test output terminal 700.

In FIG. 7, the data output terminal 102 is coupled to the data storage output 162 through an inverter 170 as described in the previous embodiments above. A second output terminal referred to as the test output terminal 700 is coupled to the data storage output 162 through an inverter 740. A delay element 720 is placed in line with the test output terminal 700, but not in the path of the data output terminal 102. In one embodiment, for example, the output of the inverter 740 is coupled to the test output terminal 700 through the delay element 720. This delay element 720 is any structure or element that will make the time delay of the path between the data storage element 130 and the test output terminal 700 greater than the hold time of the test input terminal 106.

A person skilled in the art can readily see that reversing the delay element 720 and the inverter 740 would produce the same results, as would other logically equivalent designs. Many other logical adaptations can be contemplated without changing the general nature and scope of the invention. The above description of the preferred embodiments of the present invention are disclosed for purposes of example only. They are not intended to limit the scope of the present invention.

What is claimed is:

1. A method for designing an integrated circuit having a serial scan chain of modular flip-flop cells comprising the steps of:

defining a clock terminal for said modular flip-flop cell having a clocking event when a clock signal applied to said clock terminal changes from a first clock logic state to a second clock logic state;

creating a data storage element for said modular flip-flop cell having a data storage input and a data storage output, wherein said data storage element transfers data from said data storage input to said data storage output at said clocking event;

defining a test enable terminal for said modular flip-flop cell;

defining a data input terminal for said modular flip-flop cell that is selectively coupled to said data storage input when said test enable terminal is at a first logic state;

defining a test input terminal for said modular flip-flop cell that is selectively coupled to said data storage input when said test enable terminal is at a second logic state;

determining a test input hold time being a minimum time that data must be stable on said test input terminal after said clocking event to ensure that the data is accurately transferred from said data storage input to said data storage output at said clocking event;

defining a test path from said test input terminal to said data storage element;

defining a delay element in said test path such that said test input hold time is non-positive; and placing a plurality of said modular flip-flop cells in an integrated circuit wherein said plurality of said modular flip-flop cells are daisy-chained together with said test input terminal of one flip-flop cell being coupled with said data output terminal of a preceding flip-flop cell.

2. The method of claim 1 further comprising the step of:

defining a multiplexer circuit for said modular flip-flop cell which selectively couples said data input terminal to said data storage input when said test enable terminal is at the first logic state, and selectively couples said test input terminal to said data storage input when said test enable terminal is at the second logic state, wherein said delay element is added between said test input terminal and said multiplexer circuit.

3. The method of claim 1 further comprising the step of:

defining a multiplexer circuit for said modular flip-flop cell, said multiplexer circuit having a first stage and a second stage, which selectively couples said data input terminal to said data storage input when said test enable terminal is at the first logic state, and selectively couples said test input terminal to said data storage input when said test enable terminal is at the second logic state, wherein said delay element is added between said first stage of said multiplexer circuit and said second stage of said multiplexer circuit in said test path.

4. A method for designing an integrated circuit having a serial scan chain of modular flip-flop cells comprising the steps of:

defining a clock terminal for said modular flip-flop cell having a clocking event when a clock signal applied to said clock terminal changes from a first clock logic state to a second clock logic state;

creating a data storage element for said modular flip-flop cell having a data storage input and a data storage output, wherein said data storage element transfers data from said data storage input to said data storage output at said clocking event;

defining a test enable terminal for said modular flip-flop cell;

defining a data input terminal for said modular flip-flop cell that is selectively coupled to said data storage input when said test enable terminal is at a first logic state;

defining a test input terminal for said modular flip-flop cell that is selectively coupled to said data storage input when said test enable terminal is at a second logic state;

defining a data output terminal for said modular flip-flop cell that is coupled with said data storage output;

defining a test output terminal for said modular flip-flop cell that is coupled with said data storage output, said test output terminal being physically distinct from said data output terminal;

determining a test input hold time being a minimum time that data must be stable on said test input terminal after said clocking event to ensure that the data is accurately transferred from said data storage input to said data storage output at said clocking event;

defining a delay element between said data storage output and said test output terminal such that a time delay for a signal travelling from said data storage output to said test output terminal is at least as great as said test input hold time; and placing a plurality of said modular flip-flop cells in an integrated circuit wherein said plurality of said modular flip-flop cells are daisy-chained together with said test input terminal of one modular flip-flop cell being coupled with said data output terminal of a preceding modular flip-flop cell.

5. A modular flip-flop cell comprising:

a clock terminal having a clocking event when a signal applied to said clock terminal changes from a first clock logic state to a second clock logic state;

a data storage element having a data storage input and a data storage output, wherein said data storage element transfers data from said data storage input to said data storage output at said clocking event;

a test enable terminal;

a data input terminal that is selectively coupled to said data storage input when said test enable terminal is at a first logic state;

a test input terminal that is selectively coupled to said data storage input when said test enable terminal is at a second logic state;

a test input hold time being a minimum time that data must be stable on said test input terminal after said clocking event to ensure that the data is accurately transferred from said data storage input to said data storage output at said clocking event; and means for delaying a signal on said test input terminal such that said test input hold time is non-positive.

* * * * *